US012650050B1

(12) United States Patent
Chen et al.

(10) Patent No.: US 12,650,050 B1
(45) Date of Patent: Jun. 9, 2026

(54) SYSTEMS AND METHODS FOR CONTROLLING ANNULUS BACKPRESSURE FOR MANAGED PRESSURE DRILLING

(71) Applicant: Schlumberger Technology Corporation, Sugar Land, TX (US)

(72) Inventors: Wei Chen, Katy, TX (US); Ahmed Abuelaish, Sugar Land, TX (US); Yuelin Shen, Katy, TX (US); Julien Converset, Katy, TX (US); Zhengxin Zhang, Katy, TX (US); Crispin Chatar, Katy, TX (US); Carlos Enrique Sanguinetti, Sugar Land, TX (US); May Alonge, Georgetown (GY); Fernando Gallo Zapata, Sugar Land, TX (US); Aquiles Jose Navarro Duarte, Neuquen (NZ)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

(21) Appl. No.: 19/235,825

(22) Filed: Jun. 12, 2025

(51) Int. Cl.
| | |
|---|---|
| *E21B 21/08* | (2006.01) |
| *G06F 30/27* | (2020.01) |
| *G06F 30/28* | (2020.01) |

(52) U.S. Cl.
CPC .............. *E21B 21/08* (2013.01); *G06F 30/27* (2020.01); *G06F 30/28* (2020.01); *E21B 2200/20* (2020.05)

(58) Field of Classification Search
CPC ...... E21B 21/08; E21B 2200/20; G06F 30/27; G06F 30/28
See application file for complete search history.

(56) References Cited

U.S. PATENT DOCUMENTS

| | | | | |
|---|---|---|---|---|
| 2013/0112404 | A1* | 5/2013 | Lovorn ................... | E21B 21/08 175/48 |
| 2023/0193753 | A1* | 6/2023 | Anifowose ........... | E21B 49/005 175/24 |

* cited by examiner

*Primary Examiner* — Kristyn A Hall
(74) *Attorney, Agent, or Firm* — Jeffrey D. Frantz

(57) ABSTRACT
An embodiment of a method includes receiving measurements from a drilling system during a transient period of a drilling operation for a wellbore. The measurements include measurements of annulus pressure and drilling fluid flow rate, and the transient period is a period of time when the drilling fluid flow rate is ramped up or down. In addition, the method includes training an annulus pressure model that relates an annulus frictional pressure drop over a range of drilling fluid flow rates based at least in part on the measurements. Further, the method includes controlling an annulus backpressure of the wellbore by use of the annulus pressure model after the transient period.

11 Claims, 6 Drawing Sheets

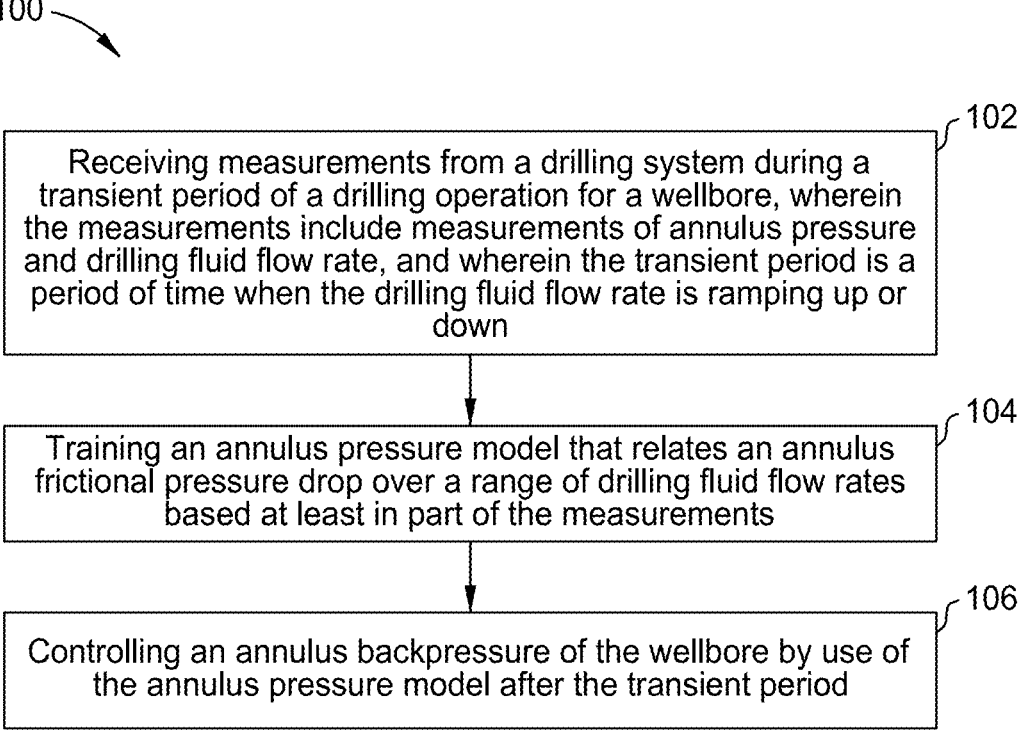

100

102

Receiving measurements from a drilling system during a transient period of a drilling operation for a wellbore, wherein the measurements include measurements of annulus pressure and drilling fluid flow rate, and wherein the transient period is a period of time when the drilling fluid flow rate is ramping up or down

104

Training an annulus pressure model that relates an annulus frictional pressure drop over a range of drilling fluid flow rates based at least in part of the measurements

106

Controlling an annulus backpressure of the wellbore by use of the annulus pressure model after the transient period

FIG. 2

Drilling Fluid Flow Rate

Annulus Pressure Loss

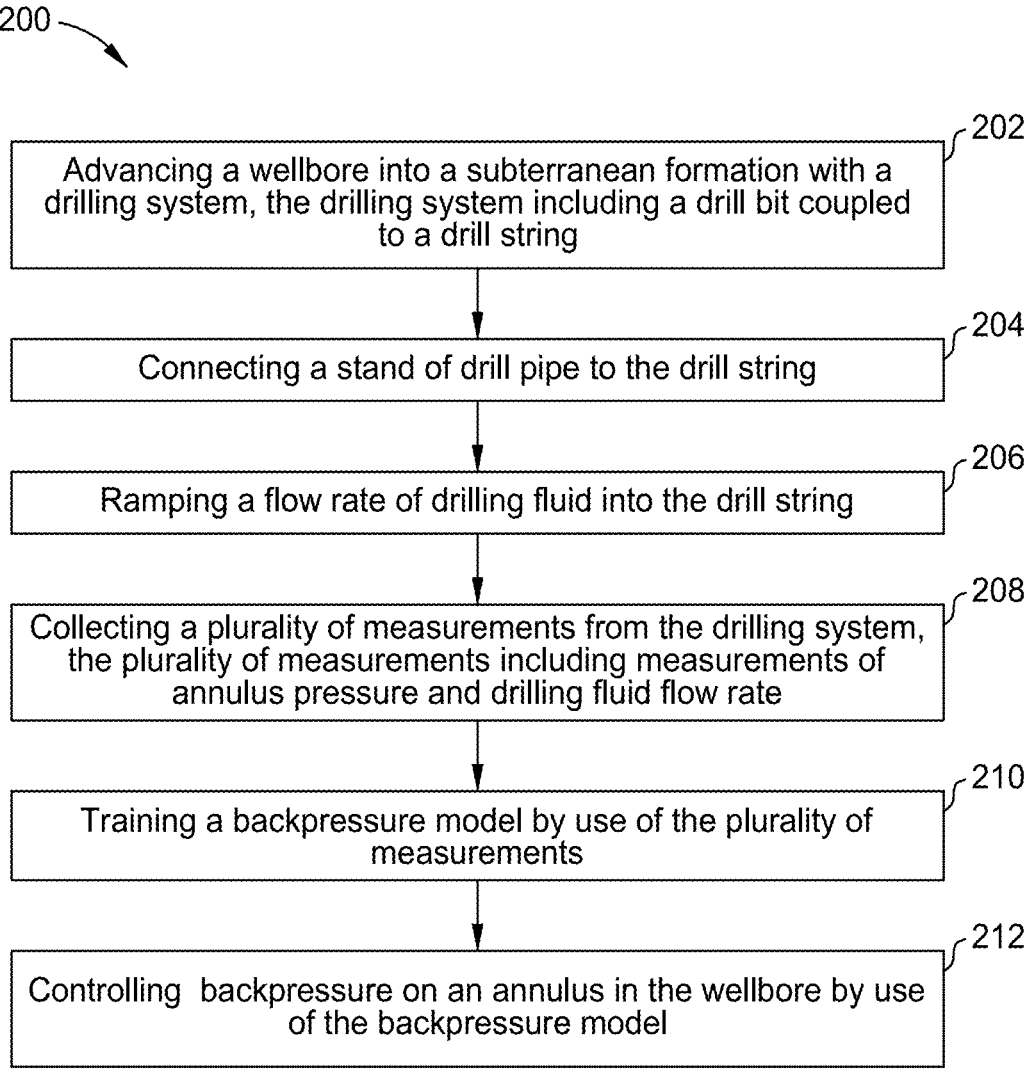

200

202
Advancing a wellbore into a subterranean formation with a drilling system, the drilling system including a drill bit coupled to a drill string 204
Connecting a stand of drill pipe to the drill string 206
Ramping a flow rate of drilling fluid into the drill string 208
Collecting a plurality of measurements from the drilling system, the plurality of measurements including measurements of annulus pressure and drilling fluid flow rate 210
Training a backpressure model by use of the plurality of measurements 212
Controlling backpressure on an annulus in the wellbore by use of the backpressure model

FIG. 8

SYSTEMS AND METHODS FOR CONTROLLING ANNULUS BACKPRESSURE FOR MANAGED PRESSURE DRILLING

BACKGROUND

Embodiments disclosed herein generally relate to systems and methods for drilling a subterranean wellbore. More specifically, embodiments disclosed herein relate to systems and methods for drilling a wellbore via managed pressure drilling.

Managed pressure drilling uses pressure control systems that control return flow of drilling fluid in a wellbore annulus to maintain a selected pressure or pressure profile in a wellbore. Generally speaking, a drilling system for performing managed pressure drilling includes a drill bit that is inserted into the wellbore via a drill string. The drill bit is rotated (e.g., from the surface and/or via a downhole mud motor) while engaging with the subterranean formation to thereby extend the wellbore. In addition, a drilling fluid (or "drilling mud") is pumped through the drill string, out from the drill bit, and into an annular space defined outside of the drill string. A backpressure assembly is connected to a fluid discharge from the annular space. This backpressure assembly is configured to adjust a backpressure on the annular space in order to maintain the selected pressure or pressure profile in the wellbore.

SUMMARY

Some embodiments disclosed herein are directed to a method including receiving, with a controller, measurements from a drilling system during a transient period of a drilling operation for a wellbore. The measurements include measurements of annulus pressure and drilling fluid flow rate, and the transient period is a period of time when the drilling fluid flow rate is ramped up or down. In addition, the method includes training, by use of the controller, an annulus pressure model that relates an annulus frictional pressure drop over a range of drilling fluid flow rates based at least in part on the measurements. Further, the method includes controlling an annulus backpressure of the wellbore by use of the annulus pressure model after the transient period.

Some embodiments disclosed herein are directed to a managed pressure drilling system including a drill string extending into a wellbore, a backpressure assembly that is configured to adjust an annulus backpressure in an annulus positioned between the drill string and the wellbore, and one or more sensors that are configured to measure or detect at least a drilling fluid flow rate and one or more pressures in the wellbore. In addition, the managed pressure drilling system includes a controller communicatively coupled to the backpressure assembly and the one or more sensors. The controller is configured to train a backpressure model that relates an annulus backpressure to a set point equivalent circulation density (ECD) in the wellbore over a range of drilling fluid flow rates based at least on data provided by the one or more sensors during a first phase of drilling. In addition, the controller is configured to adjust the annulus backpressure by use of the backpressure model during a second phase of drilling that occurs after the first phase of drilling.

Some embodiments disclosed herein are directed to a non-transitory, computer-readable medium including instructions, that when executed by a processor, cause the processor to: receive measurements from a drilling system that is drilling a wellbore during a transient period, wherein the measurements include measurements of annulus pressure measurements and drilling fluid flow rate, and wherein the transient period is a period of time when the drilling fluid flow rate is ramping up or down; train an annulus pressure model that relates an annulus frictional pressure drop over a range of drilling fluid flow rates based at least in part on the measurements; and control an annulus backpressure of the wellbore by use of the annulus pressure model after the transient period.

Some embodiments disclosed herein are directed to a method including (a) advancing a wellbore into a subterranean formation with a drilling system, the drilling system including a drill bit coupled to a drill string, (b) connecting a stand of drill pipe to the drill string, and (c) ramping a flow rate of drilling fluid into the drill string before or after (b). In addition, the method includes (d) collecting, with a controller, a plurality of measurements from the drilling system during (c), the plurality of measurements including measurements of annulus pressure and drilling fluid flow rate. Further, the method includes (e) training, by use of the controller, a backpressure model by use of the plurality of measurements. Still further, the method includes (f) controlling a backpressure on an annulus in the wellbore by use of the backpressure model after (b).

BRIEF DESCRIPTION OF DRAWINGS

For a detailed description of various exemplary embodiments, reference will now be made to the accompanying drawings in which:

FIG. 2 is a flow diagram of a method of controlling an annulus backpressure as part of a managed pressure drilling operation according to some embodiments disclosed herein;

FIG. 8 is a flow diagram of a method of controlling an annulus backpressure as part of a managed pressure drilling operation according to some embodiments disclosed herein.

DETAILED DESCRIPTION

Managed pressure drilling is utilized to maintain a desired pressure or pressure profile in a wellbore by controlling a backpressure in an annulus of the wellbore during drilling operations. Maintaining the desired pressure or pressure profile may be helpful for avoiding fluid loss into the subterranean formation and uncontrolled incursion of formation fluids (e.g., oil, gas, water, etc.) into the wellbore.

A wellbore operator may control an annulus backpressure during managed pressure drilling to maintain a specific downhole pressure or some equivalent. For instance, in some circumstances, a wellbore operator may control an annulus backpressure to achieve or maintain an Equivalent Circulation Density (ECD), which is an effective density of the circulating drilling fluid in the wellbore that is derived from a sum of hydrostatic pressure of the column of drilling fluid and the friction pressure. In some embodiments, the ECD may be controlled for a particular depth in the wellbore such as at a depth of the lowest pressure sensor (which may be positioned at a downhole end of the drill string as described herein) or some other reference point (which may be referred to herein as an "anchor point").

A subterranean wellbore is a dynamic system that includes a host of variables that change as the wellbore is extended into the subterranean formation. As a result, precise control of the annulus backpressure to achieve or maintain a desired pressure (or ECD) as part of a managed pressure drilling operation has been difficult.

Accordingly, embodiments disclosed herein include systems and methods for controlling an annulus backpressure during a managed pressure drilling operation. In some embodiments, the system and methods disclosed herein may be configured to train one or more models for determining a set point annulus backpressure to maintain or achieve a desired ECD (or pressure or pressure profile). The systems and methods may utilize real time data obtained from the drilling system in order to train and retrain the one or more models so that the corresponding control of the annulus backpressure may evolve with the changing dynamics of the wellbore as the wellbore is extended into a subterranean formation. Thus, through use of the embodiments disclosed herein, a managed pressure drilling system may achieve and maintain a desired pressure (or equivalent) in the wellbore throughout the drilling operation despite dynamic changes that may occur therein.

Figure 1:
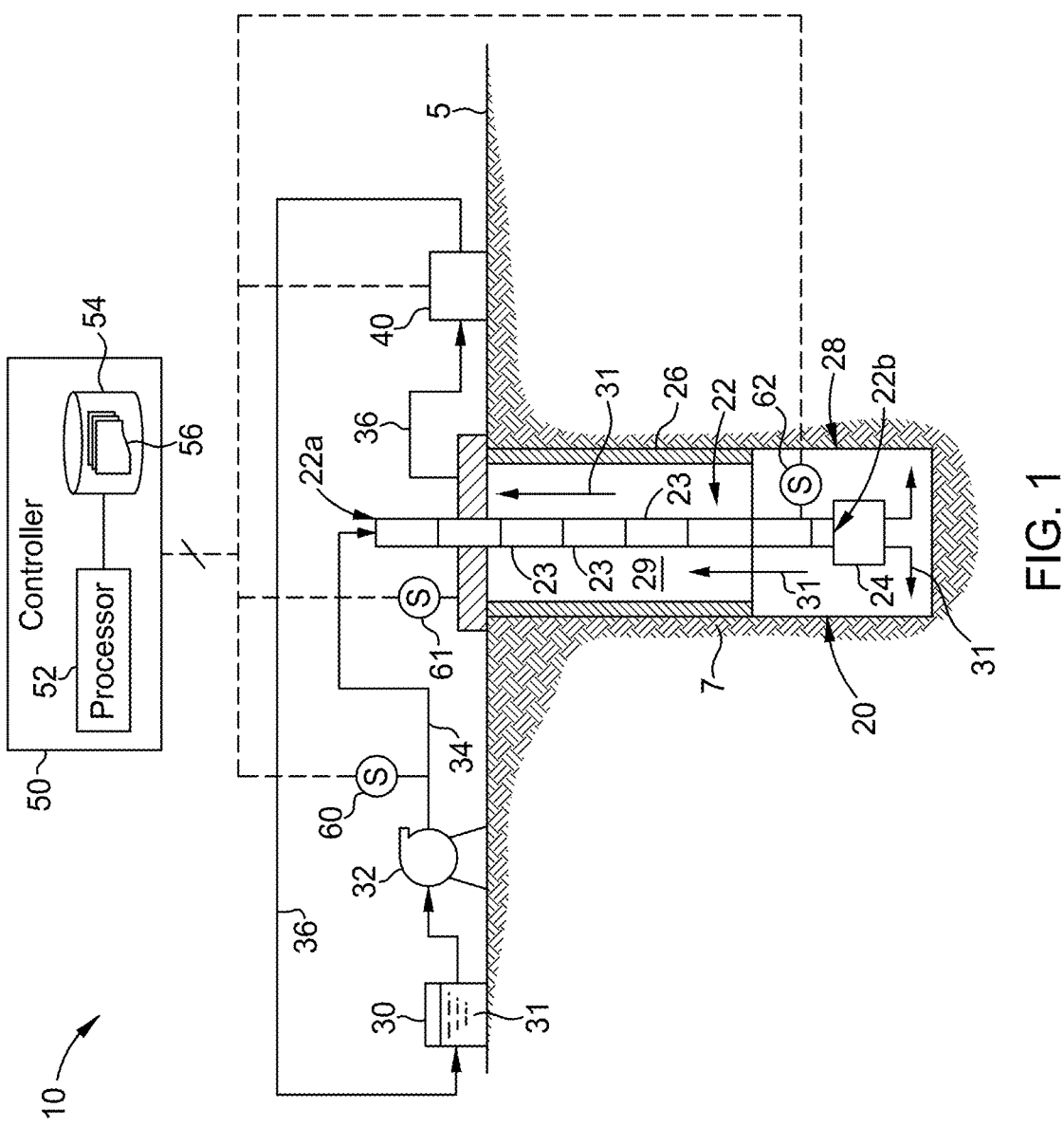
FIG. 1 is a schematic diagram of a drilling system for conducting a managed pressure drilling operation according to some embodiments disclosed herein.

Referring now to FIG. 1, a drilling system 10 for conducting a managed pressure drilling operation of a wellbore 20 that extends into a subterranean formation 7 from the surface 5 is shown according to some embodiments. The wellbore 20 is shown in FIG. 1 as a land-based wellbore 20; however, it should be appreciated that some embodiments disclosed herein may be useful for conducting a managed pressure drilling operation for a subsea wellbore.

The drilling system 10 includes a drill string 22 that extends into the wellbore 20 from the surface 5. The drill string 22 may comprise an elongate tubular string that extends from a first or uphole end 22a at (or proximate to) the surface 5 and a second or downhole end 22b that is inserted in the wellbore 20. The drill string 22 may comprise a plurality of tubular members (or "drill pipes") 23 that are coupled (such as threaded) end-to-end. In some embodiments, the drill string 22 may be progressively constructed as the wellbore 20 is drilled by adding additional drill pipes 23 or pipe stands (which may comprise a plurality of, such as three, drill pipes 23) to the uphole end 22a of the drill string 22. A drill bit 24 is coupled to the downhole end 22b of the drill string 22 (such as directly or via other devices, systems, or assemblies).

A casing (or liner pipe) 26 may be installed into at least a portion of the wellbore 20. The casing 26 may help to support the wellbore 20 against collapse and may help to prevent uncontrolled flow of formation fluids into the wellbore 20, among other functions. In some embodiments, the casing 26 may extend from (or near) the surface 5 to a depth that is less than (or above) a current bottom-hole depth of the wellbore 20. Thus, the wellbore 20 may have an open hole portion 28 that extends from a downhole end of the casing 26 to a downhole end of the wellbore 20, and the portion of the wellbore 20 that includes the casing 26 may be referred to as a "cased portion."

An annulus (or annular space) 29 is defined in the wellbore 20, outside of the drill string 22. For instance, the annulus 29 may be defined between the drill string 22 and an inner wall of the wellbore 20 (such as within the open hole portion 28) or an inner wall of the casing 26 (such as within the cased portion of the wellbore 20).

During operations, the drill bit 24 may be rotated with weight-on-bit applied so that the rotating drill bit 24 is urged into contact with the formation 7 to extend the wellbore 20. In some embodiments, the drill string 22 may be rotated via suitable devices (e.g., a Kelly, rotary table, top drive, etc.— not shown) so as to accomplish the rotation of the drill bit 24. In some embodiments, the drill bit 24 may be rotated via a downhole mud-motor (not shown) that may be coupled between the drill bit 24 and drill string 22 (e.g., as part of a bottom hole assembly or "BHA").

During these drilling operations, a drilling fluid 31 (or "drilling mud") is circulated into the wellbore 20 via the drill string 22 and drill bit 24. Specifically, one or more pumps (or "mud pumps") 32 may pump the drilling fluid 31 from a reservoir 30 (or other suitable container or holding system) into the uphole end 22a of the drill string 22 via an injection line 34. The drilling fluid 31 is then flowed through the drill string 22 and out of one or more nozzles (not shown) included in the drill bit 24. During these drilling operations, the drilling fluid 31 may lubricate and cool off the drill bit 24, and may carry cuttings (or other debris) away from the drill bit 24, among other functions.

After being emitted from the drill bit 24, the drilling fluid 31 is then flowed back uphole via the annulus 29. Upon reaching the surface 5, the drilling fluid 31 is collected into an outlet line 36 that returns the drilling fluid 31 back to the reservoir 30. In some embodiments, one or more filters or separators (such as systems for separating solids from the drilling fluid 31) may be coupled to (or along) the outlet line 36 so that debris or other contaminants are removed from the drilling fluid 31 before it is returned to the wellbore 20.

In addition, a backpressure assembly 40 is coupled to (or along) the outlet line 36. The backpressure assembly 40 may be configured to apply and adjust a backpressure on the annulus 29 via the drilling fluid 31. The backpressure assembly 40 may comprise any suitable arrangements of one or more valves, pumps, or other devices. For instance, in some embodiments, the backpressure assembly 40 may comprise one or more choke valves that are configured to selectively choke off the flow of drilling fluid 31 in the outlet line 36 to adjust a backpressure in the annulus 29. In some embodiments, the backpressure assembly 40 may comprise one or more pumps that are configured to directly apply a backpressure to the annulus 29 during operations. Still other devices or assemblies are contemplated for the backpressure assembly 40.

Referring still to FIG. 1, the drilling system 10 also includes a controller 50 that is communicatively coupled to the backpressure assembly 40. As will be described in more detail herein, the controller 50 may be configured to control the backpressure on the annulus 29 via the backpressure assembly 40 during the managed pressure drilling operation. The controller 50 may comprise a computing device or collection of computing devices that are communicatively coupled to one another.

Generally speaking, the controller 50 may comprise a processor 52 and a memory 54. The processor 52 may comprise any suitable processing device, such as a microcontroller, central processing unit (CPU), graphics processing unit (GPU), timing controller (TCON), scaler unit. The processor 52 executes computer-readable instructions (e.g., computer-readable instructions 56) stored on memory 54, thereby causing the processor 52 to perform some or all of the actions attributed herein to the controller 50. In general, processor 52 fetches, decodes, and executes instructions (e.g., computer-readable instructions 56). In addition, processor 52 may also perform other actions, such as, making determinations, detecting conditions or values, etc., and communicating signals. If processor 52 assists another component in performing a function, then processor 52 may be said to cause the component to perform the function.

The memory 54 may comprise volatile storage (e.g., random access memory (RAM)), non-volatile storage (e.g., flash storage, read-only memory (ROM), etc.), or combinations of both volatile and non-volatile storage. Data read or written by the processor 52 when executing computer-readable instructions 56 can also be stored on memory 54. Memory 54 may comprise "non-transitory computer-readable medium," where the term "non-transitory" does not encompass transitory propagating signals.

As used herein, "a processor," "at least one processor," or "one or more processors" generally refer to a single processor configured to perform one or multiple operations or multiple processors configured to collectively perform one or more operations. In the case of multiple processors, performance of the one or more operations could be divided amongst different processors, though one processor may perform multiple operations, and multiple processors could collectively perform a single operation. Similarly, "a memory," "at least one memory," or "one or more memories" generally refer to a single memory configured to store data and/or instructions or multiple memories configured to collectively store data and/or instructions.

The controller 50 may comprise a dedicated controller for controlling the backpressure in the annulus 29 for the drilling system 10. Alternatively, the controller 50 may be included as part of a general or master controller for the drilling system 10. In some embodiments, the controller 50 may be embodied as a single unit or device. Alternatively, in some embodiments, the controller 50 may be embodied as a plurality of devices that are communicatively coupled to one another and potentially remotely spaced from one another.

The controller 50 may receive measurements from one or more sensors 60, 61, 62 that are coupled throughout the drilling system 10. For instance, the controller 50 may be communicatively coupled to a first sensor 60 that is configured to measure or detect a flow rate (such as a volumetric flow rate, mass flow rate, etc.) of the drilling fluid into the drill string 22. The first sensor 60 may be positioned and configured to measure or detect a flow rate of the drilling fluid in the injection line 34.

In addition, the controller 50 may also be coupled to one or more second sensors 61, 62 to determine one or more pressures in the wellbore 20. Specifically, the second sensors 61, 62 may be configured to determine a pressure in the annulus 29 at different depths of the wellbore 20. For instance, one of the second sensors 61 may be configured to determine a pressure in the annulus 29 at (or proximate to) the surface 5, and another of the second sensors 62 may be configured to determine a pressure in the annulus 29 at (or proximate to) the downhole end 22b of the drill string 22 and/or the bottom of the wellbore 20. Still additional second sensors may be included to determine the pressure at other and/or additional depths in the annulus 29. Thus, the depiction of the second sensors 61, 62 is merely illustrative of some embodiments and is not meant to limit other embodiments that may include additional, fewer, or different arrangements of second sensors 61, 62.

The controller 50 may also be configured to receive other measurements (such as from other sensors) during operations. For instance, the controller 50 may also receive temperature measurements, such as temperature measurements from within the wellbore 20, from one or more sensors of the drilling system. In addition, the controller 50 may also receive data from one or more other sources both within and outside of the drilling system 10. In some embodiments, when the drilling system 10 is an offshore drilling system, the controller 50 may receive flow rate for a booster pump that is configured to elevate fluids through a riser that extends from the seafloor to the sea surface as this flow rate may affect the annular friction losses. In addition, in some embodiments, the rotational rate (e.g., in revolutions per minute or RPM) may be measured by a suitable sensor (or sensor array) and communicated to the controller 50 as this rotational rate may also have an effect on the annulus friction losses during operations.

As used herein, if a sensor (such as second sensors 61, 62) is said to measure or detect a property or parameter, such as flow rate, pressure, etc., this includes both direct measurement or detection of the parameter itself or the detection or measurement of some other value that is indicative of the property or parameter. For instance, a sensor (such as one of the second sensors 61, 62) may detect a pressure based on a change in electrical resistivity, capacitance, or other suitable value.

During operations, the controller 50 may control a backpressure in the annulus 29, via the backpressure assembly 40, to achieve or maintain a set point backpressure that is configured to maintain a desired pressure, pressure profile, ECD, or other equivalent in the wellbore 20. Specifically, as will be described in more detail herein, the controller 50 may train one or more models by use of real-time data obtained from the drilling system, so that the controller 50 may then utilize the trained model(s) to derive the updated backpressure set point. The one or more models may be trained and retrained by use of the real time data obtained by the controller 50 throughout the drilling operation so that the backpressure control may continuously be adjusted and refined based on the changing dynamics of the wellbore 20 during its formation.

Specifically, while drilling the wellbore 20, the flow of drilling fluid 31 may be interrupted in order to allow additional stands of drill pipe 23 to be added to an uphole end of the drill string 22. In the time periods leading up to and following the connection of a new stand of drill pipe 23, the flow rate of the drilling fluid 31 may be ramped down and then back up, respectively. These periods of ramping (or otherwise changing) drilling fluid flow rates may be referred to as "transient" periods. These transient periods may provide an opportunity to model the complex dynamics within the wellbore 20 by use of the changing fluid flow rates. Thus, the controller 50 may specifically collect data from the wellbore 20 during these transient periods and then use this collected data to train (or retrain) the one or more models for determining the updated backpressure set point. Because the dynamics of the wellbore 20 may continue to change as the depth of the wellbore 20 increases, the controller 50 may be configured to retrain the one or more models throughout the drilling operation based on subsequent transient periods (such when each or at least some new stands of drill pipe 23 are connected to the drill string 22 as previously described).

Referring now to FIG. 2, a method 100 of controlling an annulus backpressure as part of a managed pressure drilling operation is shown according to some embodiments. In some embodiments, the method 100 may be performed at least partially by use of embodiments of the drilling system 10 shown in FIG. 1. Thus, in describing the features of the method 100, continuing reference is made to the drilling system 10 of FIG. 1. However, it should be appreciated that embodiments of the method 100 may be performed by use of other drilling systems that may be different from the drilling system 10 in at least some respects. Thus, the reference to the drilling system 10 of FIG. 1 when describing the operations of method 100 is not meant to limit other embodiments of the method 100.

In addition, in some embodiments, one or more operations of the method 100 may be at least partially performed by use of a controller, such as the controller 50 of drilling system 10. Thus, the method 100 may be at least partially illustrative of the computer-readable instructions 56 stored on memory 54 and executed by the processor 52.

The method 100 may include receiving measurements from a drilling system during a transient period of a drilling operation for a wellbore at block 102. The measurements include at least measurements of annulus pressure and drilling fluid flow rate. For instance, for the drilling system 10 of FIG. 1, the controller 50 may receive measurements from the drilling system 10 via one or more sensors 60, 61, 62. The controller 50 may receive measurements of the drilling fluid flow rate via the first sensor 60, and may receive measurements of the annulus pressure via the sensors 61, 62 as previously described. For block 102, the controller 50 may specifically receive the measurements during a transient period of the drilling operation. That is, the controller 50 may receive the measurements during a period of time when the drilling fluid flow rate is ramping up or down, such as when a new stand of drill pipe 23 is connected to the drill string 22 as previously described.

Figures 3, 4:
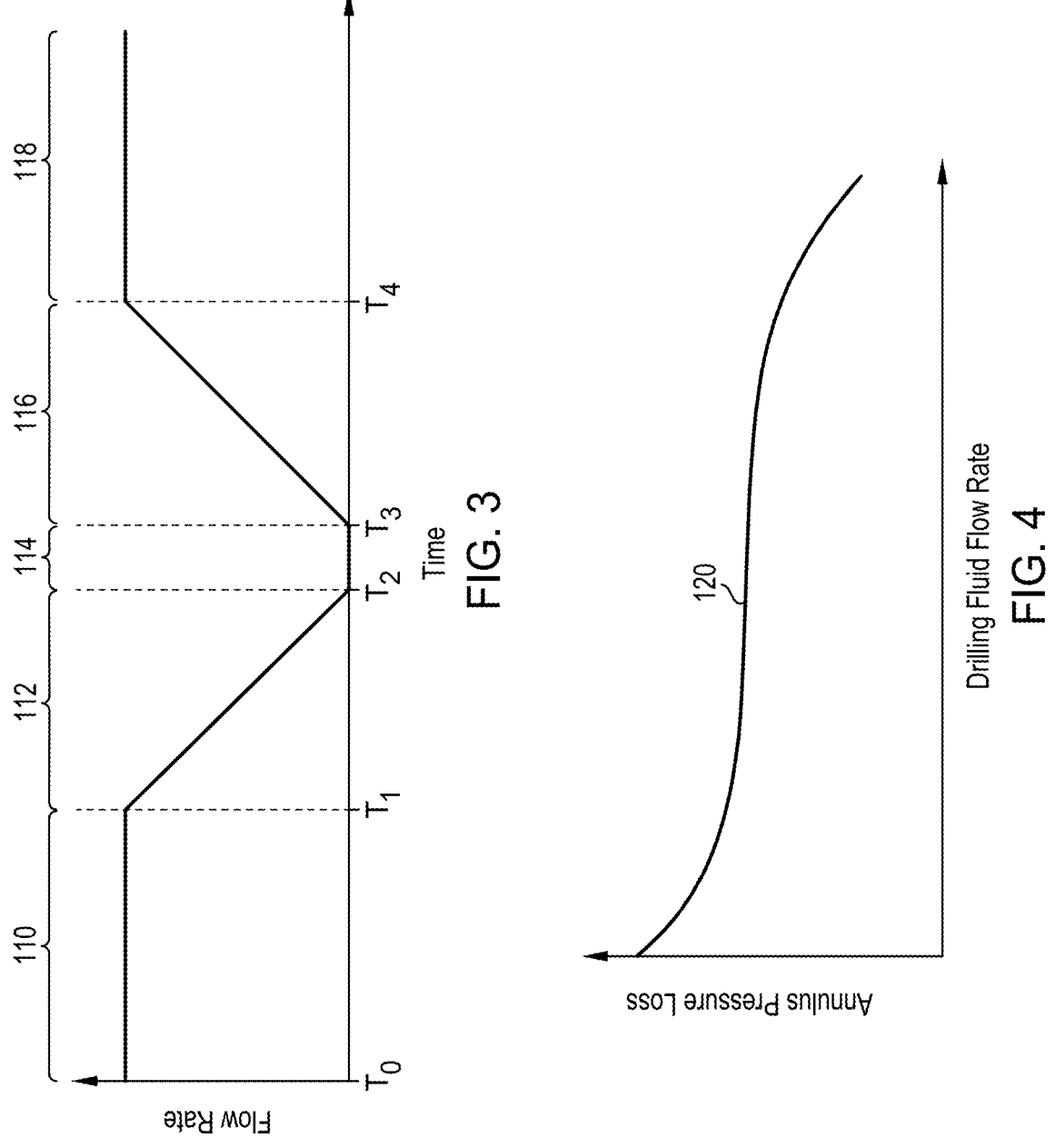
FIG. 3 is a plot of drilling fluid flow rate versus time during a portion of a drilling operation by use of the drilling system of FIG. 1 according to some embodiments disclosed herein.
FIG. 4 is a plot of annulus pressure loss versus drilling fluid flow rate that is derived by use of measurements from the drilling system of FIG. 1 according to some embodiments disclosed herein.

For example, reference is now made to FIG. 3, which shows a plot of drilling fluid flow rate relative to time for a portion of a drilling operation using an embodiment of the drilling system 10 (FIG. 1). During a first time period 110 from time $T_0$ to time $T_1$, the flow rate of drilling fluid 31 into the drill string 22 may be substantially constant (or controlled to some or a plurality of non-zero target rates). During the first time period 110, the drill string 22 may be sufficiently advanced into the wellbore 20 to warrant the connection of a new stand of drill pipe 23 as previously described. Thus, in a second time period 112 from time $T_1$ to time $T_2$, the flow rate of the drilling fluid 31 may be ramped down to facilitate the disconnection of the pump(s) 32 from the drill string 22 to allow the connection of a new stand of drill pipe 23. During the second time period 112, the flow rate of the drilling fluid 31 into the drill string 22 may be ramped down to zero (or substantially zero).

A third time period 114 may follow from time $T_2$ to time $T_3$, during which the flow rate of drilling fluid 31 into the drill string 22 is held at zero. During this third time period 114, a new stand of drill pipe 23 (or a singular drill pipe 23) is connected (such as threadedly connected) to the uphole end 22*a* of the drill string 22 to allow the drill string 22 to advance further into the wellbore 20. After the third time period 114, a fourth time period 116 from time $T_3$ to time $T_4$ is initiated where, following the connection of the new stand of drill pipe 23 to the drill string 22, the flow rate of the drilling fluid 31 into the drill string 22 is reinitiated and ramped up to a desired rate. Thereafter, during a fifth time period 118 from time $T_4$ on, the drilling fluid may once again be pumped into the drill string 22 at a desired non-zero rate.

As shown in FIG. 3, the second time period 112 and the fourth time period 116 may comprise transient periods during which the flow rate of the drilling fluid 31 is being ramped down or up, respectively, over a relatively large range. As a result, the connection of a new drill pipe 23 or stand of drill pipes 23 to the drill string 22 may generate two different transient periods. During operations, the controller 50 (as a part of block 102 in method 100) may collect measurements of at least drilling fluid flow rate (e.g., via sensor 60) and annulus pressure (e.g., via sensors 61, 62) during one or both of the transient periods of the second time period 112 and the fourth time period 116.

Referring again to FIG. 2, the method 100 also includes training an annulus pressure model that relates an annulus frictional pressure drop over a range of drilling fluid flow rates based at least in part on the measurements at block 104. As used herein, "training" a model may include updating/calibrating a model, selecting a model (or a calibrated model) based on analysis, or deriving (or generating) model. Thus, in some embodiments, the annulus pressure model may be trained at block 104 by deriving the model based on the measurements, or alternatively, the annulus pressure model may be trained in that an existing model is calibrated and selected based on the measurements.

In some embodiments, the annulus pressure model may comprise a linear regression model that is trained (via block 104 of method 100) by use of the measurements received by the controller 50 during the transient periods. As previously described, the linear regression model may relate the annulus frictional pressure drop over a range of drilling fluid flow rates. The range of drilling fluid flow rates may coincide (such as by equaling, subsuming, or at least partially overlapping) the range of flow rates that were measured during the transient periods (such as the transient periods illustrated in periods 112, 116 in FIG. 3).

In some embodiments, the linear regression model may be derived by first determining an equivalent static density (ESD) of the wellbore 20 based on the measurements. The ESD may correspond to the hydrostatic pressure that is exerted on the wellbore 20 by the static column of drilling fluid 31 when the flow of drilling fluid 31 is zero (or substantially zero). The ESD may be determined for a particular depth within the wellbore 20, such as the depth of the pressure sensor 62. In some embodiments, the ESD may be computed by use of the following mathematical expression (as Equation 1):

$$ESD = ECD_{flow=0} - \frac{SBP_{flow=0}}{TVD \times g}. \tag{1}$$

In Equation 1, $ECD_{flow=0}$ is the ECD at a particular depth in the wellbore 20, such as the depth of the pressure sensor 62, when the flow of the drilling fluid 31 into the drill string 22 is zero. In addition, in Equation 1, $SBP_{flow=0}$ is the surface backpressure in the annulus 29 (that is, the backpressure applied to the annulus 29 at or proximate to the surface 5 via the backpressure assembly 40), TVD is the true vertical depth in the wellbore 20 along the direction of gravity, and g is the gravity acceleration constant. In some embodiments, the surface backpressure may be determined via the pressure sensor 61.

Once the ESD is computed, the controller 50 may then compute the pressure drop (or "loss") in the annulus (that is, the "annulus pressure drop or loss") at different flow rates using the measurements. The annulus pressure drop may comprise a total pressure drop along the annulus 29 from the depth of the pressure sensor 62 (which may be at or proximate to the downhole end 22b of the drill string 22 as previously described) to the surface 5. The primary driver for the pressure drop in the annulus may be frictional losses as fluids (e.g., drilling fluid 31) flows along the annulus 29 toward the surface 5. In some embodiments, the annulus pressure drop may be computed at the different flow rates by use of the following mathematical expression (as Equation 2):

$$\Delta P_i = (ECD_i - ESD) \times TVD \times g - SBP_i. \tag{2}$$

In Equation 2, $\Delta P_i$ is the annulus pressure drop for each drilling fluid flow rate measurement "i", $ECD_i$ is the equivalent circulation density that was computed for each drilling fluid flow rate "i" (e.g., at the depth of the pressure sensor 62), $SBP_i$ is the surface backpressure applied to the annulus 29 for each measured drilling fluid flow rate "i", and the terms ESD, TVD, g are the same as previously described above for Equation 1. FIG. 4 illustrates a plot showing a measured trend 120 of the annulus pressure drop $\Delta P_i$ across the range of drilling fluid flow rates as computed by Equation 2 using the measured data from the transient periods is shown according to some embodiments.

The surface backpressure $(SBP_i)$ may be the backpressure applied to the annulus 29 by the backpressure assembly 40 as previously described. During the transient periods, when the measurements are being collected by the controller 50, the backpressure assembly 40 may be adjusting the backpressure applied to the annulus 29 to maintain the desired ECD in the wellbore 20. Generally speaking, as the flow rate of drilling fluid 31 into the wellbore 20 decreases, the backpressure applied to the annulus 29 via backpressure assembly 40 may increase to maintain the desired ECD in the wellbore 20. In some embodiments, the initial control of the backpressure via the backpressure assembly 40 may be accomplished via the one or more models based on a previous training according to embodiments disclosed herein. Alternatively, in some embodiments, the initial control of the backpressure may be accomplished via a standard model, control rule, or other method that may not be specifically trained as described herein, but that may provide some form of logical control of the backpressure. In still other embodiments, the backpressure assembly 40 may apply no particular control to the initial backpressure.

Once the annulus pressure drop $(\Delta P_i)$ is determined for the different flow rates measured during the transient periods, the controller 50 may then train the annulus pressure model as a linear regression model that relates the annulus pressure drop directly to the drilling fluid flow rate. For instance, the linear regression model may be represented by the following mathematical expression (as Equation 3):

$$\Delta P = c_0 X^3 + c_1 X^2 + c_2 X. \tag{3}$$

In Equation 3, X is the flow rate, $\Delta P$ is the computed annulus pressure loss at the flow rate X, and $C_0$, $C_1$, $C_2$ are constants that are derived from the linear regression. In some embodiment, the pressure loss $\Delta P$ may be normalized by the current measurement depth (MD) in the wellbore 20

$$\left(\text{e.g.,} \ \frac{\Delta P}{MD}\right)$$

to represent the annulus pressure drop per a unit measured depth. Once trained, the linear regression model of Equation 3 may provide the annulus pressure model that relates an annulus frictional pressure drop over a range of drilling fluid flow rates as previously described. In some embodiments, the flow rate X may comprise a normalized flow rate that is normalized relative to a maximum drilling fluid flow rate $$X_{max}\left(\text{e.g.,} \ \frac{X}{X_{MAX}}\right).$$

The annulus pressure drop ($\Delta P$) may be related to a backpressure set point for the backpressure assembly 40 that may provide a desired ECD in the wellbore 20 during operations. Thus, as described in more detail herein, the trained annulus pressure model of Equation 3 may be used by the controller 50 to control the backpressure on the annulus 29 via the backpressure assembly 40 after the transient periods, such as during the fifth time period 118 in the plot of FIG. 3.

As previously described, in some embodiments, the annulus pressure model may be trained at block 104 of method 100 (FIG. 2) by calibrating and selecting a model from a plurality of models based on the measurements collected by the controller 50 during the transient periods. For instance, the controller 50 may access a plurality of existing hydraulic models (or "plurality of models" more simply) that describe one or more hydraulic aspects of a wellbore (such as wellbore 20) based on assumed system dynamics. Some of the potential system dynamics that may be assumed in the plurality of models may include the rheology of the drilling fluid 31, the temperatures, pressures, flow rate, densities, etc. in the wellbore 20, and assumptions regarding the subterranean formation (such as permeability, porosity, fracture pressure, etc.), among other things.

Figure 5:
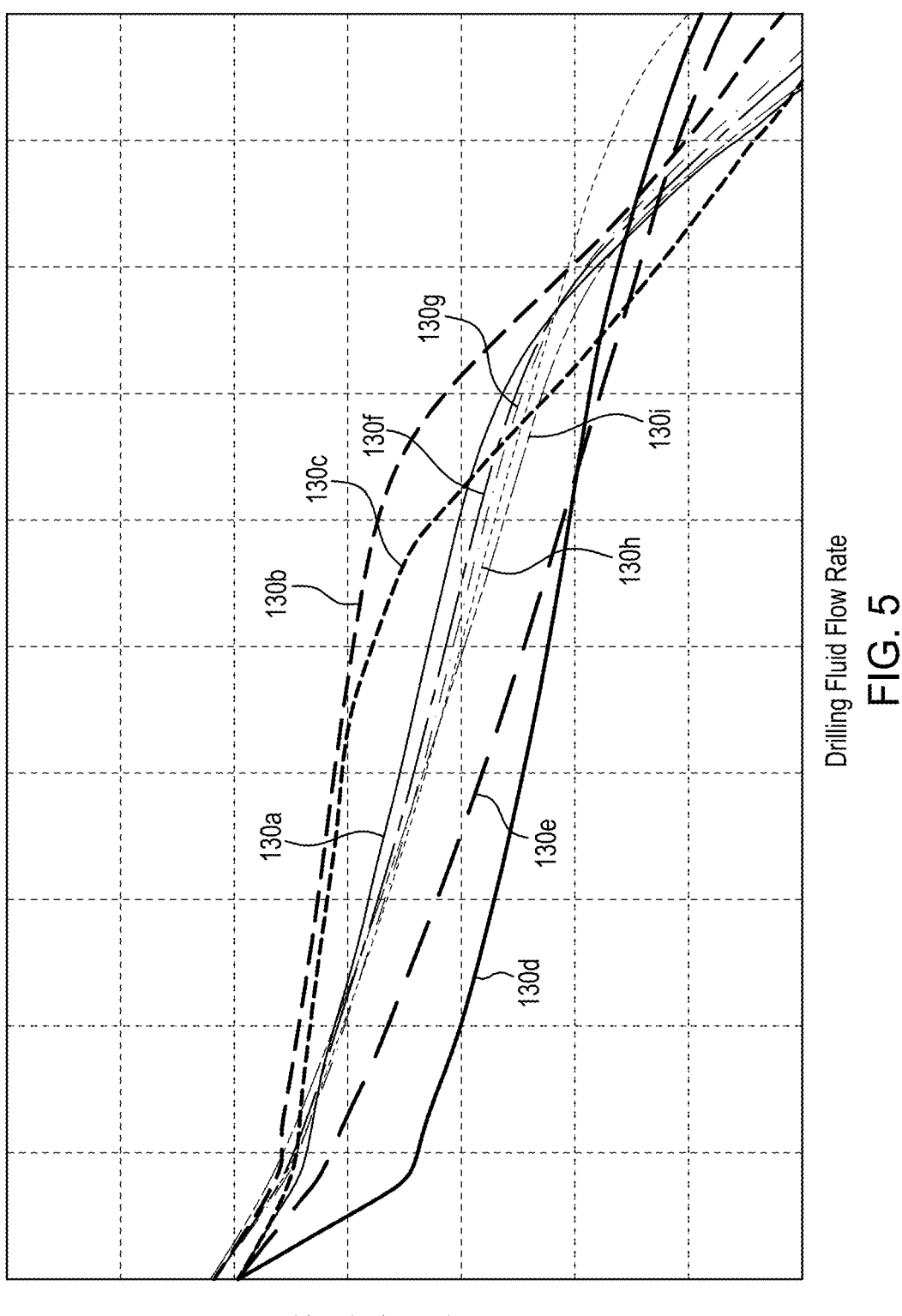
FIG. 5 is a plurality of model trends of annulus pressure loss versus drilling fluid flow rate for a plurality of models according to some embodiments disclosed herein.

Referring now to FIG. 5, a plurality of trends 130a-130i illustrating the computed annulus pressure loss across a range of drilling fluid flow rates (which may comprise a normalized flow rate as previously described) by use of a plurality of models is shown. The different assumptions utilized by the plurality of models may result in the differences in the trends 130a-130i shown in FIG. 5. Because the trends 130a-130i shown in FIG. 5 are computed based solely on the plurality of models, and not on the data collected by the controller 50, the trends 130a-130i may be referred to as "model trends." The model trends 130a-130i of FIG. 5 may be computed by use of a mathematical expression that is similar to Equation 3.

During operations, the controller 50 may calibrate and analyze the model trends 130a-130i in order to select one model of the plurality of models to function as the annulus pressure model as previously described. For instance, the controller 50 may calibrate and analyze the model trends 130a-130i by use of the measurements collected by the controller 50 during the transient periods.

Figure 6:
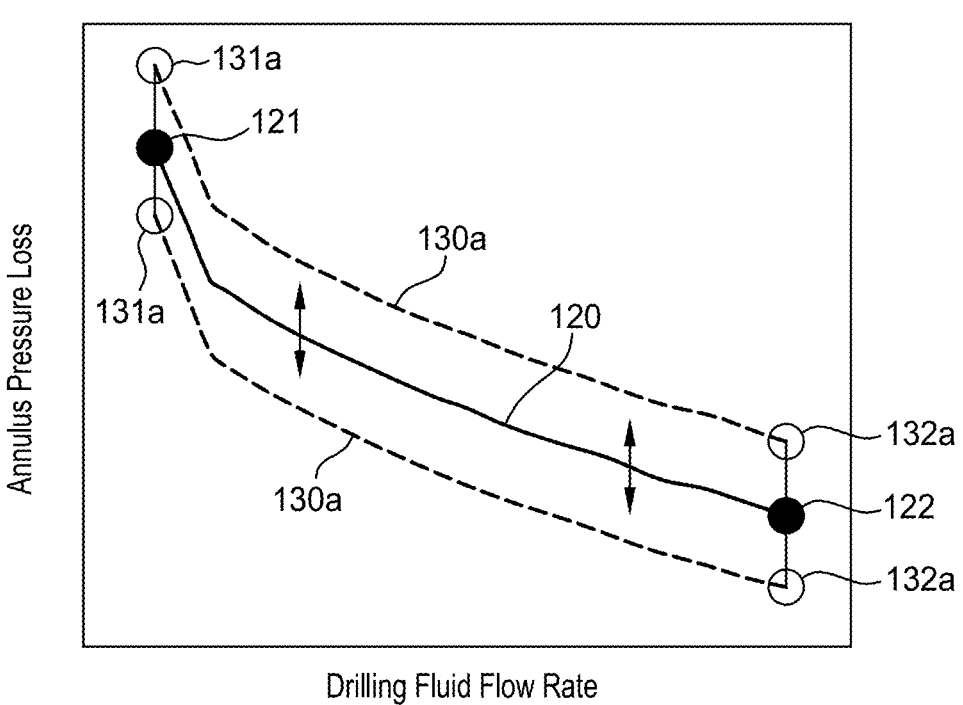
FIG. 6 illustrates a calibration of one of the model trends of FIG. 5 by use of a static calibration factor according to some embodiments disclosed herein.
Figure 7:
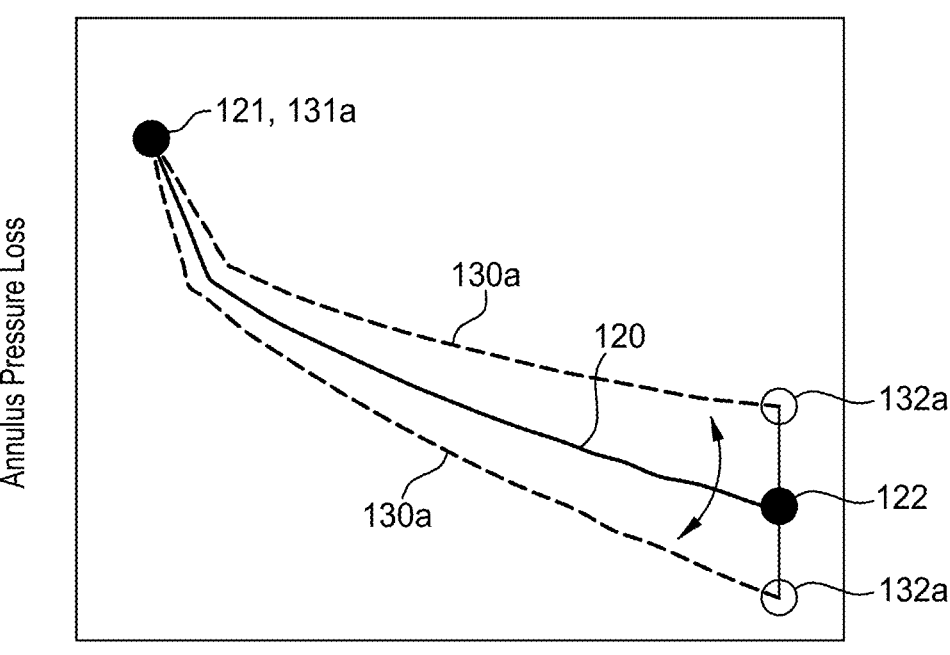
FIG. 7 illustrates a calibration of one of the model trends of FIG. 5 by use of a dynamic calibration factor according to some embodiments disclosed herein.

In some embodiments, the controller 50 may calibrate each of the model trends 130a-130i by applying one or more calibration factors in order to at least partially align each of the model trends 130*a*-130*i* with the measured trend 120 of annulus pressure drop shown in FIG. 4. In some embodiments, the controller 50 may apply both a static calibration factor and a dynamic calibration factor to at least partially align the model trends 130*a*-130*i* with the measured trend 120 of FIG. 4. The static correction factor may have a translative effect on the model trends 130*a*-130*i*, while the dynamic calibration factor may have a rotative effect on the plurality of model trends 130*a*-130*i*. Specifically, FIGS. 6 and 7 show example representations of the effect that application of the static calibration factor and the dynamic calibration factor may have on a particular model trend 130*a*, of the plurality of model trends 130*a*-130*i*, relative to the measured trend 120. The static and dynamic calibration factors may comprise mathematically applied adjustments to the functions that derive each of the model trends 130*a*-130*i*.

As shown in FIG. 6, initially, the controller 50 may adjust the static calibration factor for the model trend 130*a* in order to translate the model trend 130*a* along the Y axis (which represents the annulus pressure loss as previously described). The controller 50 may adjust the static calibration factor so that a data point 131*a* of the model trend 130*a* is aligned with the corresponding data point 121 of the measured trend 120. The data points 131*a*, 121 may be associated with a minimum flow rate along the range of drilling fluid flow rates covered by the trends 120, 130*a*.

Once the data point 131*a* of the model trend 130*a* is aligned with the corresponding data point 121 of measured trend 120 by use of the static calibration factor, the controller 50 may adjust the dynamic calibration factor to align another data point 132*a* of the model trend 130*a* with a corresponding data point 122 of the measured trend 120. Specifically, as shown in FIG. 7, the controller 50 may adjust the dynamic calibration factor in order to rotate the model trend 130*a* and thereby align the second data point 132*a* with the corresponding data point 122 of measured trend 120. The second data point 132*a* of the model trend 130*a* and the data point 122 of measured trend 120 may correspond to a maximum flow rate for the drilling fluid 31 along the range of drilling fluid flow rates.

A similar calibration, via the static and dynamic calibration factors, may be performed for each of the other model trends 130*b*-130*i*, to align one or more data points of each of the trends 130*b*-130*i* with the corresponding data points (e.g., data points 121, 122) of the measured trend 120 as previously described. Once each of the model trends 130*a*-130*i* are calibrated based on the measured trend 120, by use of the static and dynamic calibration factors as previously described, the controller 50 may then evaluate each of the calibrated model trends 130*a*-130*i* to determine which of these calibrated model trends 130*a*-130*i* most closely conforms to the measured trend 120. Specifically, in some embodiments, the controller 50 may compute an error, such as a root mean square error, between the measured trend 120 and each of the calibrated model trends 130*a*-130*i*. The calibrated model trend 130*a*-130*i* having the lowest root mean square error relative to the measured trend 120 may then be selected by the controller 50 as the annulus pressure model for controlling the backpressure in the annulus 29 via the backpressure assembly 40 as previously described.

In some embodiments, the root mean square error for each of the model trends 130*a*-130*i* may be determined by first computing a difference between the annulus pressure drop provided by each calibrated model trend 130*a*-130*i* and the measured trend 120 at a plurality of corresponding drilling fluid flow rates. The root mean square error may then be computed based on a sum of the accumulated differences across the range of drilling fluid flow rates.

In some embodiments, the model trends 130*a*-130*i* may be computed, calibrated, and evaluated (e.g., for least root mean square error) as described above, separately for two different measured trends 120. Specifically, the model trends 130*a*-130*i* may be computed, calibrated, and evaluated against a first measured trend 120 that is derived from measurements from a time period (e.g., the second time period 112 in FIG. 3) associated with a ramp down in drilling fluid flow rates. In addition, the model trends 130*a*-130*i* may also be computed, calibrated, and evaluated against a second measured trend 120 that is derived from measurements from a time period (e.g., the fourth time period 116 in FIG. 3) associated with a ramp up in drilling fluid flow rates. The result of this bifurcated analysis may provide root mean square errors for each model trend 130*a*-130*i* that are associated with both the ramp up and ramp down of drilling fluid flow rates. In some embodiments, the calibrated model trend 130*a*-130*i* with the lowest "total" root mean square error, that is the sum of the root mean square error associated with the flow rate ramp down and the root mean square error associated with the flow rate ramp up, may be selected as the trained annulus pressure model at block 104 of method 100 (FIG. 2).

Referring again to FIG. 2, once the annulus pressure model is trained via block 104, either by deriving the linear regression model of Equation 3 or by calibrating and selecting one of the plurality of models as illustrated in FIGS. 5-7, the trained annulus pressure model may then be used to control the annulus backpressure. For instance, block 106 of method 100 includes controlling an annulus backpressure of the wellbore by use of the annulus pressure model after the transient period.

In some embodiments, controlling the annulus backpressure at block 106 may be accomplished via adjustments, or other control, of the backpressure assembly 40. In some embodiments, the controller 50 may control or adjust the backpressure via the backpressure assembly 40 by directly commanding the backpressure assembly 40 to adjust the backpressure. In some embodiments, the controller 50 may control or adjust the backpressure via the backpressure assembly 40 by outputting a backpressure set point to another controller or system (such as a controller or system of the backpressure assembly 40), which may in turn control or adjust the backpressure via the backpressure assembly 40 based on the backpressure set point.

In some embodiments, the controller 50 generates a backpressure set point by use of the annulus pressure model that was trained in block 104. For instance, in some embodiments, the controller 50 may use the annulus pressure model in a backpressure model that is configured to output a set point backpressure based at least in part on the annulus pressure drop that is provided by the annulus pressure model at a particular drilling fluid flow rate.

In some embodiments, when the annulus pressure model is derived as the linear regression model of Equation 3, the controller 50 may use the annulus pressure model in a backpressure model represented by the following mathematical expression (as Equation 4):

$$BP_{SP} =$$

$$(ECD_{SP} - ESD) \times TVD \times g - \left[ \Delta P \left( \frac{X}{X_{MAX}} \right) - DCF \times \left( \frac{X}{X_{MAX}} \right) \right] \times MD. \qquad (4)$$

In Equation 4, TVD and g are the same as previously described above for Equation 1. In addition, in Equation 4, $BP_{SP}$ is the set point backpressure, $ECD_{SP}$ is the set point for the ECD at a specific depth, such as the depth of the pressure sensor 62 or another depth (such an anchor point as previously described) defined in the wellbore 20. $ECD_{SP}$ may be selected by the wellbore operator.

Also, in Equation 4, MD is the measured depth in the wellbore 20 associated with the $ECD_{SP}$ (such as the depth of the pressure sensor 62 or the depth of some other reference or anchor point as previously described). The measured depth, MD, may differ from TVD in that MD also includes any lateral deviations of the wellbore 20 as it extends down to the TVD. As a result, in some embodiments, MD may comprise or correspond to a length of the drill string 22.

Further, in Equation 4, $$\Delta P\left(\frac{X}{X_{MAX}}\right)$$

is the annulus pressure loss provided by the linear regression model of Equation 3 at a current drilling fluid flow rate, X. As shown in Equation 4, in some embodiments, the flow rate X is input to the linear regression model as a normalized flow rate relative to the maximum drilling fluid flow rate XMAX as previously described.

Still further, in Equation 4 DCF is a dynamic correction factor that may be applied to the linear regression model (Equation 3) to further conform or correct the trained model to the real-time data received by controller 50 (e.g., during the transient period). In some embodiments, the DCF may have a rotative effect on the curve of pressure loss against flow rate that may be computed by use of the linear regression model of Equation 3 as previously described. Thus, DCF may have a similar function to the dynamic calibration factor that may be applied to the plurality of model trends 130a-130i shown in FIG. 5 and previously described.

Alternatively, in some embodiments, when the annulus pressure model is derived as a selection of a calibrated model having a least root mean square error as previously described, the controller 50 may use the annulus pressure model in a backpressure model represented by the following mathematical expression (as Equation 5):

$$BP_{SP} = (ECD_{SP} - ESD - SCF) \times TVD \times g - X \times DCF \times TVD \times g - \Delta P. \quad (5)$$

In Equation 5, $BP_{SP}$, $ESC_{SP}$, and X are the same as previously described for Equation 4 and TVD and g are the same as previously described above for Equation 1. In addition, in Equation 5, $\Delta P$ is the annulus pressure loss provided by the selected model of the plurality of models. Further, in Equation 5, SCF and DCF are the static and dynamic calibration factors that were applied to the selected model of the plurality of models during the calibration illustrated in FIGS. 6 and 7 and previously described. Still further, in Equation 5, the flow rate X may be input as a normalized flow rate relative to a maximum now rate $$\left(e.g., \frac{X}{X_{MAX}}\right).$$

Thus, the set point backpressure, determined via either Equation 4 or Equation 5, may be based on the annulus pressure model, which has been trained using the measurements collected by the controller 50 from the wellbore 20 during operations. As a result, the set point backpressure may be calibrated to real-time data that is observed in the dynamic wellbore environment. Moreover, the measurement collection and training previously described above for the method 100 may be repeated a number of times during the formation of the wellbore 20. For example, the repeated trainings may occur each time there is a transient period in the drilling fluid flow rates, such as each time a new stand of drill pipe 23 is connected to the drill string 22 as previously described. This repeated training and retraining of the annulus pressure model may help to adapt the control of the annulus backpressure to the changing dynamics of the wellbore 20 as it is extended into the subterranean formation 7.

Referring now to FIG. 8, a method 200 of controlling an annulus backpressure as part of a managed pressure drilling operation is shown according to some embodiments. In some embodiments, the method 200 may be performed at least partially by use of embodiments of the drilling system 10 shown in FIG. 1. Thus, in describing the features of the method 200, continuing reference is made to the drilling system 10 of FIG. 1. However, it should be appreciated that embodiments of the method 200 may be performed by other drilling systems that may be different from the drilling system 10 in at least some respects. Thus, the reference to the drilling system 10 of FIG. 1 when describing the operations of method 200 is not meant to limit other embodiments of the method 200.

In addition, in some embodiments, one or more operations of the method 200 may be at least partially performed by use of a controller, such as the controller 50 of drilling system 10. Thus, the method 200 may be at least partially illustrative of the computer-readable instructions 56 stored on memory 54 and executed by the processor 52.

Method 200 includes advancing a wellbore into a subterranean formation with a drilling system at block 202. The drilling system may include a drill bit coupled to a drill string. For instance, as previously described for the drilling system 10 of FIG. 1, a drill string 22 extends into a wellbore 20, and a drill bit 24 may be coupled to the downhole end of the drill string 22 and rotated to engage the formation 7 and therefore extend the wellbore 20 during operations.

In addition, the method 200 includes connecting a stand of drill pipe to the drill string at block 204 and ramping a flow rate of the drilling fluid into the drill string at block 206. Ramping the flow rate of the drilling fluid at block 206 may comprise ramping the flow rate of the drilling fluid down before the new stand of drill pipe is connected to the drill string at block 204 (such as shown for the second time period 112 in FIG. 3), may comprise ramping the flow rate of the drilling fluid up after the new stand of drill pipe is connected to the drill string at block 204 (such as shown for the fourth time period 116 in FIG. 3), or may comprise a combination of both ramping the flow rate of the drilling fluid up and ramping the rate of the drilling fluid down.

Further, the method 200 comprises collecting a plurality of measurements from the drilling system at block 208. The plurality of measurements collected at block 208 may be associated with the period of time during which the flow rate of the drilling fluid was ramped as per block 206. In addition, the plurality of measurements may include measurement of annulus pressure and drilling fluid flow rate. For instance, for the drilling system 10 of FIG. 1, the controller 50 may receive measurements from the drilling system 10 via one or more sensors 60, 61, 62. The controller 50 may receive measurements of the drilling fluid flow rate via the first sensor 60, and may receive measurements of the annulus pressure via the sensors 61, 62 as previously described.

The method 200 also includes training a backpressure model by use of the plurality of measurements at block 210. Training the backpressure model may comprise training an annulus pressure model as previously described, and then using or incorporating the trained annulus pressure model in the backpressure model. Thus, training the backpressure model may comprise training a component or portion of the backpressure model according to some embodiments.

The method 200 may also include controlling a backpressure on an annulus in the wellbore by use of the backpressure model at block 212. As previously described for the drilling system 10, controlling the backpressure on the annulus 29 may comprise controlling one or more aspects of the backpressure assembly 40. As is also previously described, control of the backpressure assembly 40 by the controller 50 may be direct or indirect, such as via other controllers or other system.

As explained above and reiterated below, the present disclosure includes, without limitation, the following example Aspects.

Aspect 1: A method comprising: (a) receiving, with a controller, measurements from a drilling system during a transient period of a drilling operation for a wellbore, wherein the measurements include measurements of annulus pressure and drilling fluid flow rate, and wherein the transient period is a period of time when the drilling fluid flow rate is ramped up or down; (b) training, by use of the controller, an annulus pressure model that relates an annulus frictional pressure drop over a range of drilling fluid flow rates based at least in part on the measurements; and (c) controlling an annulus backpressure of the wellbore by use of the annulus pressure model after the transient period.

Aspect 2: The method of any of the Aspects, further comprising: (d) generating, after (b), a backpressure model that computes a backpressure by a set point equivalent circulation density (ECD) minus a predicted annulus frictional pressure loss based on the annulus pressure model, wherein (c) further comprises determining a set point annulus backpressure by use of the backpressure model.

Aspect 3: The method of any of the Aspects, wherein (c) further comprises: computing the set point annulus backpressure at a measured drilling fluid flow rate to maintain the set point ECD, by use of the backpressure model; and adjusting the annulus backpressure based on the set point annulus backpressure.

Aspect 4: The method of any of the Aspects, wherein the transient period is a first transient period and the measurements are first measurements, and wherein the method further comprises: (e) receiving, with the controller, second measurements from the drilling system during a second transient period, wherein the second measurements include annulus pressure measurements and drilling fluid flow rate measurements, and wherein the second transient period is another period of time when the drilling fluid flow rate into the wellbore is ramped up or down that occurs after the first transient period; (f) retraining, by use of the controller, the annulus pressure model based at least in part on the second measurements; and (g) controlling the annulus backpressure of the wellbore by use of the annulus pressure model after (f).

Aspect 5: The method of any of the Aspects, further comprising: (h) connecting a first stand of drill pipe to a drill string of the drilling system, wherein the first transient period occurs when the drilling fluid flow rate is ramped up or down as part of (h); and (i) connecting a second stand of drill pipe to the drill string after (h), wherein the second transient period occurs when the drilling fluid flow rate is ramped up or down as part of (i).

Aspect 6: The method of any of the Aspects, wherein the annulus pressure model comprises a linear regression model.

Aspect 7: The method of any of the Aspects, wherein (b) further comprises: (b1) computing a plurality of model trends of annulus frictional pressure drop across the range of drilling fluid flow rates by use of a plurality of models; (b2) computing a measured trend of annulus frictional pressure drop across the range of drilling fluid flow rates by use of the measurements; (b3) computing a least mean square error between each of the plurality of model trends and the measured trend; and (b4) selecting a first model of the plurality of models as the annulus pressure model based on a determination that the model trend associated with the first model has a lowest least mean square error.

Aspect 8: The method of any of the Aspects, wherein (b) further comprises: (b5) calibrating the plurality of model trends to align one or more data points of each of the plurality of model trends with one or more corresponding data points of the measured trend, wherein (b3) is performed after (b5).

Aspect 9: A managed pressure drilling system comprising: a drill string extending into a wellbore; a backpressure assembly that is configured to adjust an annulus backpressure in an annulus positioned between the drill string and the wellbore; one or more sensors that are configured to measure or detect at least a drilling fluid flow rate and one or more pressures in the wellbore; a controller communicatively coupled to the backpressure assembly and the one or more sensors, wherein the controller is configured to: train a backpressure model that relates an annulus backpressure to a set point equivalent circulation density (ECD) in the wellbore over a range of drilling fluid flow rates based at least on data provided by the one or more sensors during a first phase of drilling; and adjust the annulus backpressure by use of the backpressure model during a second phase of drilling that occurs after the first phase of drilling.

Aspect 10: The managed pressure drilling system of any of the Aspects, wherein the controller is configured to train the backpressure model by use of data provided by the one or more sensors during a transient period of the first phase of drilling, wherein the transient period comprises a period of time when the drilling fluid flow rate is ramped up or down.

Aspect 11: The managed pressure drilling system of any of the Aspects, wherein the controller is further configured to: retrain the backpressure model based on data provided by the one or more sensors during a transient period of the second phase of drilling to produce a retrained model; and adjust the annulus backpressure by use of the retrained model during a third phase of drilling that occurs after the second phase of drilling.

Aspect 12: The managed pressure drilling system of any of the Aspects, wherein the first phase of drilling commences when a first stand of drill pipe is added to the drill string, wherein the second phase of drilling commences when a second stand of drill pipe is added to the drill string, and wherein the third phase of drilling commences when a third stand of drill pipe is added to the drill string.

Aspect 13: The managed pressure drilling system of any of the Aspects, wherein the backpressure model includes a linear regression model of annulus frictional pressure drop across the range of drilling flow rates.

Aspect 14: The managed pressure drilling system of any of the Aspects, wherein the controller is configured to train the backpressure model by: computing a plurality of model trends of annulus frictional pressure drop across the range of drilling fluid flow rates by use of a plurality of models; computing a measured trend of annulus frictional pressure drop across the range of drilling fluid flow rates by use of the data provided by the one or more sensors during the first phase of drilling; calibrating the plurality of model trends to align one or more data points of each of the plurality of model trends with one or more corresponding data points of the measured trend; computing a least mean square error between each of the plurality of model trends and the measured trend after the calibrating; and selecting a first model of the plurality of models for use in the backpressure model based on a determination that the model trend associated with the first model has a lowest least mean square error.

Aspect 15: A non-transitory, computer-readable medium including instructions, that when executed by a processor, cause the processor to: (a) receive measurements from a drilling system that is drilling a wellbore during a transient period, wherein the measurements include measurements of annulus pressure measurements and drilling fluid flow rate, and wherein the transient period is a period of time when the drilling fluid flow rate is ramping up or down; (b) train an annulus pressure model that relates an annulus frictional pressure drop over a range of drilling fluid flow rates based at least in part on the measurements; and (c) control an annulus backpressure of the wellbore by use of the annulus pressure model after the transient period.

Aspect 16: The non-transitory, computer-readable medium of any of the Aspects, wherein the instructions, when executed by the processor, further cause the processor to: (d) generate, after (b) a backpressure model that computes a backpressure by a set point equivalent circulation density (ECD) minus a predicted annulus frictional pressure loss based on the annulus pressure model, wherein (c) further comprises determining a set point annulus backpressure by use of the backpressure model.

Aspect 17: The non-transitory, computer-readable medium of any of the Aspects, wherein the transient period is a first transient period and the measurements are first measurements, and wherein the instructions, when executed by the processor, further cause the processor to: (d) receive second measurements from the drilling system during a second transient period, wherein the second measurements include annulus pressure measurements and drilling fluid flow rate measurements, and wherein the second transient period is another period of time when the drilling fluid flow rate into the wellbore is ramping up or down that occurs after the first transient period; (e) retrain the annulus pressure model based at least in part on the second measurements; and (f) control the annulus backpressure of the wellbore by use of the annulus pressure model after (e).

Aspect 18: The non-transitory, computer-readable medium of any of the Aspects, wherein the first transient period is associated with a connection of a first stand of drill pipe to a drill string of the drilling system, and wherein the second transient period is associated with a connection of a second stand of drill pipe to the drill string.

Aspect 19: The non-transitory, computer-readable medium of any of the Aspects, wherein the annulus pressure model comprises a linear regression model.

Aspect 20: The non-transitory, computer-readable medium of any of the Aspects, wherein (b) further comprises: (b1) compute a plurality of model trends of annulus pressure drop across the range of drilling fluid flow rates by use of a plurality of models; (b2) compute a measured trend of annulus pressure drop across the range of drilling fluid flow rates by use of the first measurements; (b3) calibrate the plurality of model trends to align one or more data points of each of the plurality of model trends with one or more corresponding data points of the measured trend; (b4) compute a least mean square error between each of the plurality of model trends and the measured trend after (b3); and (b5) select a first model of the plurality of models as the annulus pressure model based on a determination that the model trend associated with the first model has a lowest least mean square error.

Aspect 21: A method comprising: (a) advancing a wellbore into a subterranean formation with a drilling system, the drilling system including a drill bit coupled to a drill string; (b) connecting a stand of drill pipe to the drill string; (c) ramping a flow rate of drilling fluid into the drill string before or after (b); (d) collecting, with a controller, a plurality of measurements from the drilling system during (c), the plurality of measurements including measurements of annulus pressure and drilling fluid flow rate; (e) training, by use of the controller, a backpressure model by use of the plurality of measurements; and (f) controlling a backpressure on an annulus in the wellbore by use of the backpressure model after (b).

Aspect 22: The method of any of the Aspects, further comprising: (g) connecting another stand of drill pipe to the drill string; (h) ramping the flow rate of drilling fluid into the drill string before or after (g) (i) collecting, with the controller, a second plurality of measurements from the drilling system during (h), the second plurality of measurements including measurements of annulus pressure and drilling fluid flow rate; and (j) retraining, with the controller, the backpressure model by use of the second plurality of measurements.

Aspect 23: The method of any of the Aspects, wherein (e) further comprises: (e1) computing, with the controller, a root mean square error between each of a plurality of model trends of annulus frictional drop across a range of drilling fluid flow rates determined by a plurality of models and a measured trend of annulus frictional pressure drop determined by the plurality of measurements; and (e2) selecting a first model of the plurality of models for use in the backpressure model based on a determination that the first model has a lowest root mean square error.

Aspect 24: The method of any of the Aspects, wherein (e) further comprises: (e1) computing, with the controller, a root mean square error between each of a plurality of model trends of annulus frictional drop across a range of drilling fluid flow rates determined by a plurality of models and a measured trend of annulus frictional pressure drop determined by the plurality of measurements; and (e2) selecting a first model of the plurality of models for use in the backpressure model based on a determination that the first model has a lowest root mean square error.

Aspect 25: The method of any of the Aspects, wherein (e3) further comprises, for each model trend of the plurality of model trends: applying a first calibration to align at least a first data point of the model trend with the measured trend at a minimum value of the range of drilling fluid flow rates; and applying a second calibration to align at least a second data point of the model trend with the measured trend for each of the plurality of models at a maximum value of the range of drilling fluid flow rates.

Aspect 26: The method of any of the Aspects, wherein the backpressure model includes a linear regression model of annulus frictional pressure drop across a range of drilling flow rates.

Embodiments disclosed herein include systems and methods for controlling an annulus backpressure during a managed pressure drilling operation. In some embodiments, the system and methods disclosed herein may be configured to train one or more models for determining a set point annulus backpressure to maintain or achieve a desired ECD (or pressure or pressure profile). The systems and methods may utilize real time data obtained from the drilling system in order to train and retrain the one or more models so that the corresponding control of the annulus backpressure may evolve with the changing dynamics of the wellbore as the wellbore is extended into a subterranean formation. Thus, through use of the embodiments disclosed herein, a managed pressure drilling system may achieve and maintain a desired pressure (or equivalent) in the wellbore throughout the drilling operation despite dynamic changes that may occur therein.

The preceding discussion is directed to various embodiments. However, one of ordinary skill in the art will understand that the examples disclosed herein have broad application, and that the discussion of any embodiment is meant only to be exemplary of that embodiment, and not intended to suggest that the scope of the disclosure, including the claims, is limited to that embodiment.

The drawing figures are not necessarily to scale. Certain features and components herein may be shown exaggerated in scale or in somewhat schematic form and some details of conventional elements may not be shown in interest of clarity and conciseness.

In the preceding discussion and in the claims, the terms "including" and "comprising" are used in an open-ended fashion, and thus should be interpreted to mean "including, but not limited to" Also, the term "couple" or "couples" is intended to mean either an indirect or direct connection. Thus, if a first device couples to a second device, that connection may be through a direct connection of the two devices, or through an indirect connection that is established via other devices, components, nodes, and connections. In addition, as used herein, the terms "axial" and "axially" generally mean along or parallel to a given axis (e.g., central axis of a body or a port), while the terms "radial" and "radially" generally mean perpendicular to the given axis.

For instance, an axial distance refers to a distance measured along or parallel to the axis, and a radial distance means a distance measured perpendicular to the axis. Further, when used herein (including in the claims), the words "about," "generally," "substantially," "approximately," and the like, when used to refer to a stated value, mean within a range of plus or minus 10% of the stated value.

While exemplary embodiments have been shown and described, modifications thereof can be made by one skilled in the art without departing from the scope or teachings herein. The embodiments described herein are exemplary only and are not limiting. Many variations and modifications of the systems, apparatus, and processes described herein are possible and are within the scope of the disclosure. Accordingly, the scope of protection is not limited to the embodiments described herein, but is only limited by the claims that follow, the scope of which shall include all equivalents of the subject matter of the claims. Unless expressly stated otherwise, the operations in a method claim may be performed in any order. The recitation of identifiers such as (a), (b), (c) or (1), (2), (3) before operations in a method claim are not intended to and do not specify a particular order to the operations, but rather are used to simplify subsequent reference to such operations.

What is claimed is:

1. A method comprising:
   (a) receiving, with a controller, measurements from a drilling system during a transient period of a drilling operation for a wellbore, wherein the measurements include measurements of annulus pressure and drilling fluid flow rate, and wherein the transient period is a period of time when the drilling fluid flow rate is ramped up or down;
   (b) training, by use of the controller, an annulus pressure model that relates an annulus frictional pressure drop over a range of drilling fluid flow rates based at least in part on the measurements, wherein (b) includes:
      (b1) computing a plurality of model trends of annulus frictional pressure drop across the range of drilling fluid flow rates by use of a plurality of models;
      (b2) computing a measured trend of annulus frictional pressure drop across the range of drilling fluid flow rates by use of the measurements;
      (b3) computing a least mean square error between each of the plurality of model trends and the measured trend; and
      (b4) selecting a first model of the plurality of models as the annulus pressure model based on a determination that a model trend associated with the first model has a lowest least mean square error; and
   (c) controlling an annulus backpressure of the wellbore by use of the annulus pressure model after the transient period.

2. The method of claim 1, further comprising:
   (d) generating, after (b), a backpressure model that computes a backpressure by a set point equivalent circulation density (ECD) minus a predicted annulus frictional pressure loss based on the annulus pressure model,
   wherein (c) further comprises determining a set point annulus backpressure by use of the backpressure model.

3. The method of claim 2, wherein (c) further comprises:
   computing the set point annulus backpressure at a measured drilling fluid flow rate to maintain the set point ECD, by use of the backpressure model; and
   adjusting the annulus backpressure based on the set point annulus backpressure.

4. The method of claim 1, wherein the transient period is a first transient period and the measurements are first measurements, and wherein the method further comprises:

(e) receiving, with the controller, second measurements from the drilling system during a second transient period, wherein the second measurements include annulus pressure measurements and drilling fluid flow rate measurements, and wherein the second transient period is another period of time when the drilling fluid flow rate into the wellbore is ramped up or down that occurs after the first transient period;

(f) retraining, by use of the controller, the annulus pressure model based at least in part on the second measurements; and (g) controlling the annulus backpressure of the wellbore by use of the annulus pressure model after (f).

5. The method of claim 4, further comprising:

(h) connecting a first stand of drill pipe to a drill string of the drilling system, wherein the first transient period occurs when the drilling fluid flow rate is ramped up or down as part of (h); and (i) connecting a second stand of drill pipe to the drill string after (h), wherein the second transient period occurs when the drilling fluid flow rate is ramped up or down as part of (i).

6. The method of claim 1, wherein (b) further comprises:

(b5) calibrating the plurality of model trends to align one or more data points of each of the plurality of model trends with one or more corresponding data points of the measured trend, wherein (b3) is performed after (b5).

7. A managed pressure drilling system comprising:

a drill string extending into a wellbore;

a backpressure assembly that is configured to adjust an annulus backpressure in an annulus positioned between the drill string and the wellbore;

one or more sensors that are configured to measure or detect at least a drilling fluid flow rate and one or more pressures in the wellbore;

a controller communicatively coupled to the backpressure assembly and the one or more sensors, wherein the controller is configured to:

train a backpressure model that relates an annulus backpressure to a set point equivalent circulation density (ECD) in the wellbore over a range of drilling fluid flow rates based at least on data provided by the one or more sensors during a transient period of a first phase of drilling, wherein the transient period comprises a period of time when the drilling fluid flow rate is ramped up or down, and wherein the first phase of drilling commences when a first stand of drill pipe is added to the drill string;

adjust the annulus backpressure by use of the backpressure model during a second phase of drilling that occurs after the first phase of drilling, wherein the second phase of drilling commences when a second stand of drill pipe is added to the drill string;

retrain the backpressure model based on data provided by the one or more sensors during a transient period of the second phase of drilling to produce a retrained model; and adjust the annulus backpressure by use of the retrained model during a third phase of drilling that occurs after the second phase of drilling, wherein the third phase of drilling commences when a third stand of drill pipe is added to the drill string.

8. The managed pressure drilling system of claim 7, wherein the backpressure model includes a linear regression model of annulus frictional pressure drop across the range of drilling fluid flow rates.

9. The managed pressure drilling system of claim 7, wherein the controller is configured to train the backpressure model by:

computing a plurality of model trends of annulus frictional pressure drop across the range of drilling fluid flow rates by use of a plurality of models;

computing a measured trend of annulus frictional pressure drop across the range of drilling fluid flow rates by use of the data provided by the one or more sensors during the transient period of the first phase of drilling;

calibrating the plurality of model trends to align one or more data points of each of the plurality of model trends with one or more corresponding data points of the measured trend;

computing a least mean square error between each of the plurality of model trends and the measured trend after the calibrating; and selecting a first model of the plurality of models for use in the backpressure model based on a determination that a model trend associated with the first model has a lowest least mean square error.

10. A non-transitory, computer-readable medium including instructions, that when executed by a processor, cause the processor to:

(a) receive first measurements from a drilling system that is drilling a wellbore during a first transient period, wherein the first measurements include measurements of annulus pressure and drilling fluid flow rate, wherein the first transient period is a period of time when the drilling fluid flow rate is ramping up or down, and wherein the first transient period is associated with a connection of a first stand of drill pipe to a drill string of the drilling system;

(b) train an annulus pressure model that relates an annulus frictional pressure drop over a range of drilling fluid flow rates based at least in part on the first measurements, wherein (b) includes:

(b1) compute a plurality of model trends of annulus pressure drop across the range of drilling fluid flow rates by use of a plurality of models;

(b2) compute a measured trend of annulus pressure drop across the range of drilling fluid flow rates by use of the first measurements;

(b3) calibrate the plurality of model trends to align one or more data points of each of the plurality of model trends with one or more corresponding data points of the measured trend;

(b4) compute a least mean square error between each of the plurality of model trends and the measured trend after (b3); and (b5) select a first model of the plurality of models as the annulus pressure model based on a determination that a model trend associated with the first model has a lowest least mean square error;

(c) control an annulus backpressure of the wellbore by use of the annulus pressure model after the first transient period;

(d) receive second measurements from the drilling system during a second transient period, wherein the second measurements include annulus pressure measurements and drilling fluid flow rate measurements, wherein the second transient period is another period of time when the drilling fluid flow rate into the wellbore is ramping up or down that occurs after the first transient period, and wherein the second transient period is associated with a connection of a second stand of drill pipe to the drill string;

(e) retrain the annulus pressure model based at least in part on the second measurements; and (f) control the annulus backpressure of the wellbore by use of the annulus pressure model after (e).

11. The non-transitory, computer-readable medium of claim 10, wherein the instructions, when executed by the processor, further cause the processor to:

(d) generate, after (b), a backpressure model that computes a backpressure by a set point equivalent circulation density (ECD) minus a predicted annulus frictional pressure loss based on the annulus pressure model, wherein (c) further comprises determining a set point annulus backpressure by use of the backpressure model.

* * * * *